United States Patent [19]

DeVilbiss

[11] Patent Number: 4,701,744

[45] Date of Patent: Oct. 20, 1987

[54] METHOD AND APPARATUS FOR COMPACTING AND DE-COMPACTING TEXT CHARACTERS

[75] Inventor: Warren C. DeVilbiss, Indianapolis, Ind.

[73] Assignee: RCA Corporation, Princeton, N.J.

[21] Appl. No.: 844,837

[22] Filed: Mar. 27, 1986

[51] Int. Cl.⁴ .............................................. H03M 7/30
[52] U.S. Cl. .............................. 340/347 DD; 364/900; 178/113
[58] Field of Search ............... 340/347 DD; 364/200, 364/900; 178/113

[56] References Cited

PUBLICATIONS

Principles of Communication Theory, John C. Hancock, McGraw-Hill, 1961, pp. 166-167.
Reference Data for Radio Engineers, Howard W. Sams & Co., Inc. Fourth Printing, 1972, p. 30.38.

*Primary Examiner*—T. J. Sloyan
*Attorney, Agent, or Firm*—Paul J. Rasmussen; Peter M. Emanuel; Richard G. Coalter

[57] ABSTRACT

A television receiver includes a micro-computer which controls the receiver functions and provides on-screen display of messages for prompting the user. Display characters are compacted to minimize memory space by encoding the characters in 4-bit nibbles to maximize storage efficiency in a ROM organized to store 8-bit bytes.

8 Claims, 13 Drawing Figures

| CHAR CODE | | CHAR SET "A" | CHAR SET "B" |
|---|---|---|---|
| HEX | BINARY | | |
| 0 | 0 0 0 0 | SHIFT | SHIFT |
| 1 | 0 0 0 1 | A | N |
| 2 | 0 0 1 0 | C | B |
| 3 | 0 0 1 1 | E | . |
| 4 | 0 1 0 0 | H | F |
| 5 | 0 1 0 1 | I | G |
| 6 | 0 1 1 0 | L | K |
| 7 | 0 1 1 1 | U | V |
| 8 | 1 0 0 0 | N | W |
| 9 | 1 0 0 1 | O | Y |
| A | 1 0 1 0 | P | : |
| B | 1 0 1 1 | R | / |
| C | 1 1 0 0 | S | — |
| D | 1 1 0 1 | T | ! |
| E | 1 1 1 0 | D | ? |
| F | 1 1 1 1 | * | + |

| CHAR. CODE | | CHAR. SET "A" | CHAR. SET "B" |
|---|---|---|---|
| HEX | BINARY | | |
| 0 | 0 0 0 0 | SHIFT | SHIFT |
| 1 | 0 0 0 1 | A | M |
| 2 | 0 0 1 0 | C | B |
| 3 | 0 0 1 1 | E | * |
| 4 | 0 1 0 0 | H | F |
| 5 | 0 1 0 1 | I | G |
| 6 | 0 1 1 0 | L | K |
| 7 | 0 1 1 1 | U | V |
| 8 | 1 0 0 0 | N | W |
| 9 | 1 0 0 1 | O | Y |
| A | 1 0 1 0 | P | : |
| B | 1 0 1 1 | R | / |
| C | 1 1 0 0 | S | − |
| D | 1 1 0 1 | T | 1 |
| E | 1 1 1 0 | D | 2 |
| F | 1 1 1 1 | # | + |

*Fig.2*

| BYTE | HEX | CHAR. |
|------|-----|-------|
| 1 | 38 | EN |
| 2 | D3 | TE |
| 3 | 8F | R # |
| 4 | 24 | CH |
| 5 | 18 | AN |
| 6 | 83 | NE |
| 7 | 6F | L # |
| 8 | 87 | NU |
| 9 | 01 | M |
| 10 | 20 | B |
| 11 | 3B | ER |
| 12 | 00 | (EOT) |

Bytes 1–3: ENTER
Bytes 4–7: CHANNEL
Bytes 8–11: NUMBER

*Fig. 3*

```
;
;Note:    '#' is a block and '!' is a space.
;
;ACEHILUNOPRSTD#MB!FGKVWY:/-12+
;
OSD0:   DB   $C4,$1B,$A8,$3C,$C0,$00                    ;SHARPNESS (DA1)
OSD1:   DB   $29,$69,$B0,$00                            ;COLOR (DA2)
OSD2:   DB   $D5,$8D,$00                                ;TINT (DA3)
OSD3:   DB   $02,$06,$12,$06,$0F,$63,$07,$03,$60,$00    ;BLACK!LEVEL (DA4)
OSD4:   DB   $A5,$2D,$7B,$30,$00                        ;PICTURE (DA5)
OSD5:   DB   $17,$D9,$29,$69,$B0,$A0,$F0,$00            ;AUTOCOLOR:#
OSD6:   DB   $02,$01,$61,$82,$30,$00                    ;BALANCE (DA7)
OSD7:   DB   $D8,$30,$20,$63,$00                        ;TREBLE (DA8)
OSD8:   DB   $02,$01,$CC,$00                            ;BASS (DA9)
OSD9:   DB   $17,$E5,$90,$A0,$F0,$00                    ;AUDIO:#
OSD10:  DB   $17,$E5,$9F,$02,$A0,$F0,$00                ;AUDIO"B:#
OSD11:  DB   $CA,$31,$06,$03,$BC,$0A,$0F,$00            ;SPEAKERS:#
OSD12:  DB   $C6,$33,$AF,$D5,$01,$03,$B0,$00            ;SLEEP!TIMER
OSD13:  DB   $83,$C3,$D0,$00                            ;RESET
OSD14:  DB   $16,$1B,$01,$B0,$D5,$01,$03,$60,$00        ;ALARM/TIMER
OSD15:  DB   $1B,$D3,$88,$10,$A0,$F5,$8A,$7D,$F1,$00    ;ANTENNA:#INPUT#A
OSD45:  DB   $10,$00                                    ;A
OSD16:  DB   $D5,$01,$03,$FC,$3D,$00                    ;TIME#SET
OSD17:  DB   $21,$02,$06,$30,$B0,$15,$B0,$A0,$F0,$00    ;CABLE/AIR:#
OSD18:  DB   $17,$D9,$AB,$90,$50,$B1,$01,$00            ;AUTOPROGRAM
OSD19:  DB   $24,$1B,$83,$6F,$01,$03,$01,$09,$B0,$90,$00  ;CHANNEL#MEMORY
OSD20:  DB   $02,$01,$20,$65,$0B,$97,$8E,$0A,$0F,$00    ;BACKGROUND:#
OSD21:  DB   $A5,$2D,$7B,$3F,$01,$03,$01,$09,$B0,$90,$00  ;PICTURE#MEMORY
OSD22:  DB   $A9,$0B,$03,$BF,$69,$CC,$FB,$3C,$3D,$00    ;POWER#LOSS#RESET
OSD23:  DB   $03,$00                                    ;!
OSD24:  DB   $07,$09,$67,$01,$03,$00                    ;VOLUME
```

*Fig.9*

```
; TIME SET MENUS
OSD25:  DB   $AB,$90,$50,$B1,$01,$0F,$00            ;PROGRAM#
OSD26:  DB   $0C,$CA,$CC,$00                        ;--:--
OSD27:  DB   $10,$1C,$D0,$FA,$01,$CE,$00            ;AM-1#PH-2
OSD28:  DB   $24,$1B,$B3,$6F,$0C,$C0,$00            ;CHANNEL#--
OSD29:  DB   $01,$07,$D3,$00                        ;MUTE
```

Fig.10

```
; PICTURE RESET MESSAGES
OSD30: DB  $03,$00                                                   ;#
OSD31: DB  $03,$30,$A7,$C4,$F0,$F0,$FD,$9F,$CD,$9B,$30,$00  ;##PUSH#+#TO#STORE
OSD32: DB  $03,$30,$27,$BB,$38,$DF,$C3,$DD,$5B,$05,$0C,$00  ;##CURRENT#SETTINGS
OSD33: DB  $03,$0A,$7C,$4F,$0C,$0F,$D9,$FB,$3C,$D9,$B3,$00  ;#PUSH-#TO#RESTORE
OSD34: DB  $03,$09,$B5,$05,$05,$B1,$6F,$C3,$DD,$5B,$05,$0C,$00 ;#ORIGINAL#SETTINGS
OSD35: DB  $CD,$9B,$30,$00                                       ;STORE
```

Fig.11

```
; TOGGLE FUNCTION MESSAGES
OSD36:  DB   $21,$02,$06,$30,$00                                    ;CABLE
OSD37:  DB   $15,$B0,$33,$00                                        ;AIR!!
OSD38:  DB   $98,$03,$00                                            ;ON!
OSD39:  DB   $90,$44,$00                                            ;OFF
OSD40:  DB   $CD,$3B,$39,$00                                        ;STEREO
OSD41:  DB   $01,$09,$89,$03,$30,$00                                ;MONO!!
OSD42:  DB   $D5,$01,$03,$00                                        ;TIME
OSD43:  DB   $16,$1B,$01,$00                                        ;ALARM
OSD44:  DB   $3B,$1C,$30,$00                                        ;ERASE
OSD46:  DB   $02,$00                                                ;B
OSD47:  DB   $C6,$33,$AF,$00                                        ;SLEEP!
OSD48:  DB   $A7,$C4,$FC,$3D,$7A,$F0,$40,$9B,$F0,$10,$9B,$30,$00    ;PUSH#SETUP#FOR#MORE
OSD49:  DB   $18,$DF,$02,$00                                        ;ANT#B
OSD50:  DB   $FF,$F1,$7E,$F0,$20,$FF,$00                            ;###AUD#B##
OSD51:  DB   $FF,$CD,$3B,$39,$FF,$00                                ;##STEREO##
OSD52:  DB   $24,$18,$83,$60,$00                                    ;CHANNEL
OSD53:  DB   $CD,$3B,$39,$F8,$9D,$FC,$36,$32,$D3,$E0,$00            ;STEREO#NOT#SELECTED
OSD54:  DB   $CD,$3B,$39,$FB,$32,$35,$07,$03,$E0,$00                ;STEREO#RECEIVED
OSD55:  DB   $CD,$3B,$39,$FC,$30,$00                                ;STEREO#SET
OSD56:  DB   $17,$E5,$9F,$02,$0F,$83,$23,$50,$70,$3E,$00            ;AUDIO#B#RECEIVED
OSD57:  DB   $17,$E5,$9F,$02,$0F,$AB,$30,$40,$3B,$B3,$E0,$00        ;AUDIO#B#PREFERRED
OSD58:  DB   $A7,$C4,$FC,$01,$07,$CF,$04,$09,$BF,$01,$09,$83,$00    ;PUSH#STATUS#FOR#MORE
OSD59:  DB   $90,$44,$0F,$00                                        ;OFF!
OSD60:  DB   $17,$D9,$E3,$01,$09,$00                                ;AUTODEMO
OSD61:  DB   $A7,$C4,$F0,$F0,$FD,$9F,$5B,$2B,$31,$C3,$00            ;PUSH#+#TO#INCREASE
OSD62:  DB   $A7,$C4,$F0,$C0,$FD,$9F,$E3,$2B,$31,$C3,$00            ;PUSH#-#TO#DECREASE
OSD63:  DB   $A1,$83,$8D,$16,$F2,$98,$DB,$76,$00                    ;PARENTAL#CONTROL
OSD64:  DB   $24,$32,$06,$0F,$D5,$01,$03,$00                        ;CHECK#TIME
```

*Fig.12*

```
; PARENTAL CONTROL DISPLAYS
OSD65:  DB   $A1,$B3,$BD,$16,$F0,$20,$69,$20,$6A,$0F,$00         ;PARENTAL#BLOCK:#
OSD66:  DB   $03,$0A,$7C,$4F,$0F,$0F,$09,$FD,$7B,$BF,$00         ;#PUSH#+#TO#TURN#
OSD67:  DB   $03,$02,$41,$88,$36,$CF,$02,$05,$92,$06,$03,$E0,$A0,$00
                                                                 ;#CHANNELS#BLOCKED:
OSD68:  DB   $03,$0A,$7C,$4F,$C3,$D7,$AF,$D9,$F3,$BE,$00         ;#PUSH#SETUP#TO#END
OSD69:  DB   $01,$05,$E8,$50,$50,$4D,$0C,$D0,$FF,$B9,$9B,$0C,$E0,$00
                                                                 ;MIDNIGHT-1##NOON-2
OSD70:  DB   $A7,$C4,$F0,$F0,$FD,$9F,$02,$03,$05,$05,$30,$00     ;PUSH#+#TO#BEGIN
OSD71:  DB   $58,$FA,$B9,$05,$0B,$3C,$C0,$00                     ;IN#PROGRESS
OSD72:  DB   $24,$F0,$CC,$00                                     ;CH#--
OSD73:  DB   $3B,$D3,$BF,$24,$1B,$83,$6F,$B7,$01,$20,$3B,$00     ;ENTER#CHANNEL#NUMBER
OSD74:  DB   $B9,$DF,$00                                         ;NOT#
OSD75:  DB   $5B,$F0,$10,$30,$10,$9B,$09,$00                     ;IN#MEMORY
OSD76:  DB   $03,$33,$0C,$08,$05,$02,$43,$EF,$A9,$08,$03,$B0,$00 ;###SWITCHED#POWER
OSD77:  DB   $03,$33,$0A,$90,$80,$3B,$F9,$80,$A0,$F0,$00         ;###POWER#ON:#
OSD78:  DB   $A7,$C4,$F0,$F0,$FD,$9F,$00                         ;PUSH#+#TO#
OSD79:  DB   $03,$33,$33,$02,$41,$88,$36,$F0,$CC,$00             ;####CHANNEL#--
OSD80:  DB   $09,$03,$C0,$00                                     ;YES
OSD81:  DB   $B9,$03,$00                                         ;NO#
OSD82:  DB   $12,$D5,$07,$01,$D3,$00                             ;ACTIVATE
OSD83:  DB   $E5,$C1,$02,$06,$30,$30,$00                         ;DISABLE
;
        END
```

METHOD AND APPARATUS FOR COMPACTING AND DE-COMPACTING TEXT CHARACTERS

FIELD OF THE INVENTION

This invention relates to methods for reducing the number of bits required for storing text characters in a memory (compaction) and to apparatus for de-compacting characters recovered from the memory.

BACKGROUND OF THE INVENTION

It is generally desirable to minimize the amount of memory storage capacity required to store a given number of characters representing text. This is particularly important in applications using so-called "one chip" microcomputers in which a microprocessor and its associated memories and input-output devices are integrated to form a self-contained computer on a chip. Since memory storage space is limited in one-chip micro-computers, the storage efficiency is of greater importance than in microprocessor systems employing external memories which are easily expandable.

The efficiency of storage of text characters is a function of the number of unique characters to be stored, the code used to represent the characters and the memory organization. As an example, assume that text is encoded using the standard 7-bit ASCII (American Standard Code for Information Interchange) code format. This format is commonly used by input/output (I/O) devices such as keyboards, television display character generators, printers and the like. This 7-bit code (8-bits with parity or a control bit) can uniquely represent 128 individual characters. As used herein, "character" includes letters, punctuation, numbers, symbols, control codes the like associated with textual material. If a memory is organized to provide 8-bits (one byte) of storage per address location and text is stored in the ASCII (7-bit) format, then the efficiency would be only 50%. This results because an 8-bit byte can uniquely represent 256 possible states whereas only 128 states are used in the 7-bit ASCII code format.

Code formats requiring fewer than 7-bits to represent text are known. For example, in the 5-bit Baudot code used in some teleprinter transmission systems characters are divided into two sets and sequentially transmitted "shift" characters are used to select the appropriate set for printing. The principle is much the same as that provided by the shift keys of an ordinary typewriter for reducing the number of keys required. Specifically, a transmission of letters is preceded by the letters shift code 11111 (binary) and a transmission of figures is preceded by a figures shift code 11011 (binary). The shift codes are stored in a printer for selecting letters or figures for printing.

The 5-bit Baudot code has the capability of transmitting 60 unique characters. This results because 5-bits define 32 unique states. Two codes are "dedicated", so to speak, to the shift up (LETTERS, 11111 in binary) and shift down (FIGURES, 11011 in binary) codes. This leaves 30 states (32-2) remaining to represent text for letters and (because of the shift) another 30 states to represent figures for a total of 60 characters.

Although only 5-bits are required to transmit 60 characters, the Baudot code is even less efficient than ASCII when stored in an 8-bit organized memory since three bits per byte are unused. The efficiency is at best only about 23% since only 60 of 256 possible states are used and the efficiency decreases with the number of shift codes that are included in the text.

SUMMARY OF THE INVENTION

The present invention is directed to meeting the need for improving the efficiency of storage of text characters in memories organized in such a manner that the number of bits per character is different from the number of bits per byte of a memory storage location. In an embodiment of the invention described herein text characters are compacted to a 4-bit format enabling two characters per byte to be stored in a read only memory (ROM) having an 8-bit organization.

A method of compacting characters embodying the invention comprises generating a sequence of characters in which some characters are of a first character set and other characters are of a second character set. A given shift character, not taken from either character set, is inserted in the sequence of characters every time a character of one set is followed by a character of the other set. The sequence of characters is stored in a memory means in which each memory address represents at least one pair of stored characters.

Apparatus, embodying the invention, for decompacting characters stored in a memory, in a format wherein each memory address location stores at least a pair of characters, comprises a means for reading the memory and providing a sequence of characters in which some characters are of a first character set, other characters are of a second character set and in which a unique shift indicating character separates characters of the sequence from different sets. Means are provided, responsive to the shift indicating character, for decoding all characters of the first set in accordance with a first code table and for decoding all characters of the second set in accordance with a second code table to provide a sequence of decoded output characters.

BRIEF DESCRIPTION OF THE DRAWINGS

In the drawing

FIG. 2 is a table illustrating a character code used in the decompacting apparatus of FIG. 1;

FIG. 3 is a table illustrating compaction of a specific message displayed by the receiver of FIG. 1;

FIGS. 9-13 comprise program listings of on-screen display messages stored in compacted form in a ROM memory of the receiver of FIG. 1.

DETAILED DESCRIPTION

Figure 1:
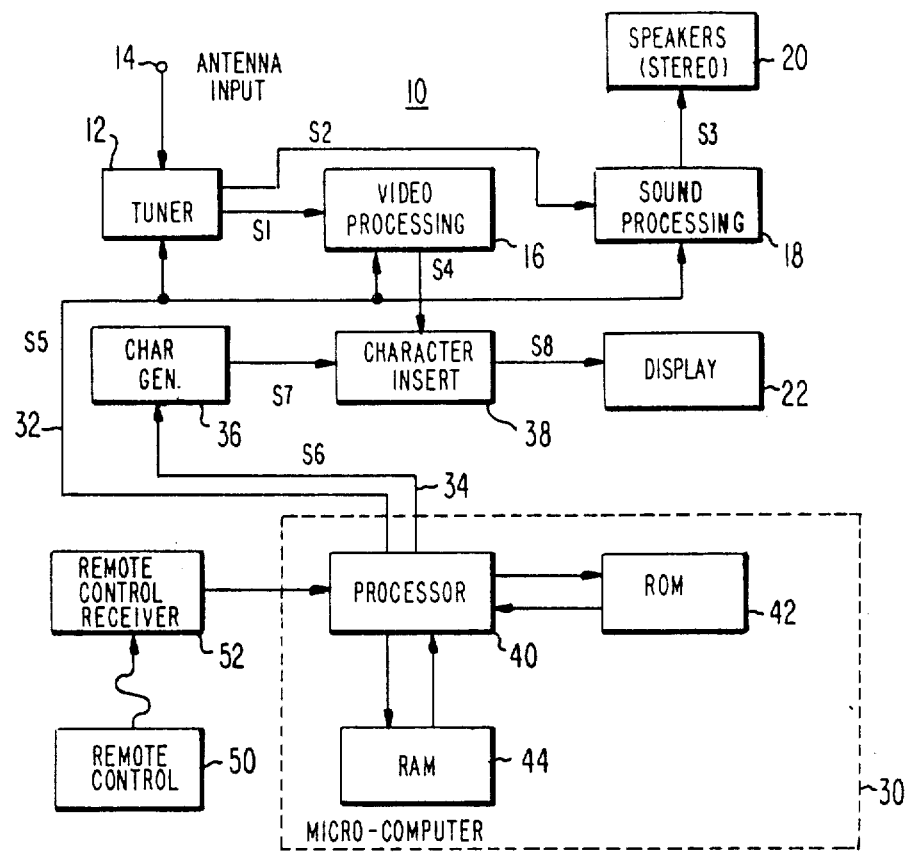
FIG. 1 is a block diagram of a television receiver including character decompacting apparatus embodying the invention.

FIG. 1 illustrates the principles of character compaction and decompaction in accordance with the invention as applied to a television receiver. The receiver (10) includes a tuner/demodulator unit 12 having an antenna input 14 for receiving a television signal modulated on a radio frequency (RF) carrier and outputs supplying demodulated picture (S1) and sound (S2) signals to respective video (16) and audio (18) processing units.

Unit 18 provides various sound progressing functions (e.g., mono/stereo selection, tone control, muting, etc.) and provides processed sound signals (S3) to a stereo speaker unit 20. Video processing unit 16 provides various picture processing functions (e.g., saturation and hue control, contrast control, peaking, etc.) and supplies a processed video signal (S4) to a display unit 22.

Control signals (S5) for tuner 12, video processing unit 16 and audio processing unit 18 are provided by means of a micro-computer 30 coupled thereto via bus 32. As an aid to operation of the receiver, micro-computer 30 supplies various messages in ASCII code format (signals S6) via bus 34 to a character generator 36 which converts the ASCII coded messages to a raster scan format signal (S7) suitable for display on display unit 22. Character insertion unit 38 combines the output of generator 36 (S6) and the processed video signal of unit 16 (S4) to provide a display signal (S8) in which text characters (as hereinbefore defined) are overlayed with picture signals so as to inform the user of current receiver operating functions and to prompt the user in setting up (selecting) new receiver operating functions.

Micro-computer 30 is a self contained "computer on a chip" and includes a processor 40 coupled via data and address buses to internal read-only (ROM) and random access (RAM) memories 42 and 44, respectively. Processor 40 provides conventional functions of arithmetic and logic (ALU) processing, input and output (I/O) processing, pointer control and so forth. A micro-computer suitable for use as unit 30 is the type 6305YO manufactured, for example, by Hatachi. This part has internal ROM and RAM capacities of 8K and 256 bytes, respectively, organized on an 8-bit per byte basis.

Overall control of receiver 10 is provided by a user operated remote control unit 50 which is coupled to an input port of processor 40 in micro computer 30 via a remote control receiver unit 52.

In operation, when a user presses one or more keys on remote control unit 50, processor 40 fetches an appropriate instruction from ROM 42 and sends signals via bus 32 to the tuner, video and/or audio processing units to implement the desired instruction. Concurrently, processor 40 also selects messages in compacted form from ROM 42, translates the messages to ASCII and sends the ASCII coded messages to character generator 36 for display on unit 22 as a prompt or confirmation to the user of the remote control.

FIGS. 9-15 illustrate both the need for character compacting in ROM 42 and certain aspects of the solution according to the invention. As shown, there are a total of 84 message "strings" (numbered OSD0 to OSD83, OSD stands for "on screen display"). Some messages may be shown singly (e.g., "enter channel number") more complex messages may be formed by combining shorter messages. FIG. 9 lists general control messages (sharpness, color, tint, etc.). FIG. 10 lists messages specific to time setting functions. FIG. 11 lists picture reset messages (push to store, etc.). FIG. 12 lists toggle function messages (e.g., on-off, mono-stereo, etc.). FIG. 13 lists messages specific to parental control displays. In all, the 84 messages stored in ROM 42 total 827 characters.

The 827 characters of FIGS. 9-13, if stored in ROM 42 using ASCII coding, would require 827 memory locations. This amounts to about 10% of the total ROM memory space which is a substantial portion of the memory considering that the ROM 42 must also store instructions for executing the large number of functions indicated by the messages. The messages are stored in compacted form in ROM 42 so as to provide maximum memory space for instruction storage.

In this specific example of the invention the 827 message characters stored in ROM 42 are compacted to 612 memory locations (bytes). This provides a savings of over 200 bytes of ROM or a compaction to 75% of the message memory space which otherwise would be required using ASCII coding.

Considering now the details of text data compaction in accordance with the invention, it is shown in FIGS. 9-13 that all of the text "strings" can be formed using only 30 different characters. These 30 character are divided into two sets of 15 characters each and stored as 4-bit codes in ROM 42. A single shift character (0000 in binary) is inserted between characters of different sets to facilitate set selection during de-compaction.

FIG. 2 provides a listing of the code assignments for the 30 text characters and the single shift character (0000) in both binary and hexidecimal notation. As shown, each character, including the shift character (0000), comprises 4-bits. Thus, two characters of compacted code may be stored in a single (8-bit) byte of ROM 42. Of course, the shift character 0000 does require memory space and this has an effect on the storage efficiency. For the 827 characters of FIGS. 9-13 there are a total of 197 shift characters used to compact the code to 612 bytes. Even so, the savings of 26% of memory space (827 reduced to 612 bytes) is substantial.

FIG. 3 provides a specific example of compaction of the on-screen display (OSD) message number 73 of the "Parental Control Displays" listing of FIG. 13 as stored in ROM 42. The message is "ENTER # CHANNEL # NUMBER". The symbol # represents a "block" space. In FIG. 2 there are two symbols for spaces between characters. The character * of set "B" is a "see through" space symbol which character generator 36 inserts between words without blocking the video signal being displayed. When the # character is used for a space the video is blocked by a black background.

In FIG. 3 the portion of the message "ENTER # CHANNEL # NU" is comprised of characters which are all taken from the character set (A) of FIG. 2. These 16 characters sequence require only 8 bytes of storage. The letters M and B are of character set "B". In accordance with the invention, at byte 9 the code for letter M is preceded by the shift character "0" (Hex) to identify M and B as being of a different character set "B". The identical shift character "0" is inserted in byte 10 after the code for "B" to signify that the remaining characters (ER) are of set "A". Byte 12 comprises a pair of shift characters "00"- (Hex) which signifies the end of the message (EOT stands for end of transmission).

To summarize, in FIG. 3 the 20 character message ENTER # CHANNEL # NUMBER is encoded in 4-bit bytes and requires only 12 bytes of ROM storage including the two shift characters and the end of transmission character (00, Hex).

The shift character "0000" in the present invention provides a "toggle" function, that is, the character does not actually identify either of the two character sets. What the shift characters does is to signify a change in character sets. This is important because it is essential to the invention that 30 text characters (as hereinbefore defined) be represented in a 4-bit code. Four bits can uniquely represent only 16 states. By using a single shift character (0000) this leaves 15 possible states for each one of two character sets which provides a total of 30 characters which can be represented. If the Baudot shift technique were to be used in a 4-bit format, the absolute maximum number of characters which could be represented is only 28 which is two short of what is required to represent 30 characters used in the 84 messages of FIGS. 9-13.

Figure 4:
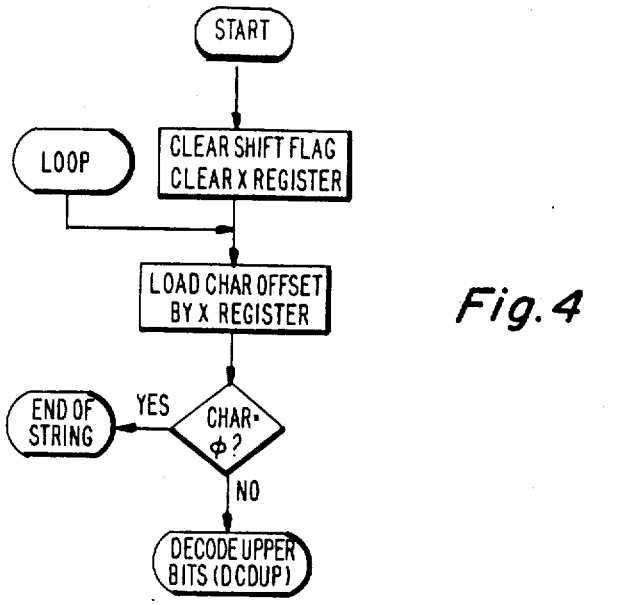
FIGS. 4, 5 and 6 are flow charts illustrating operation of the decompaction apparatus in the receiver of FIG. 1.
Figure 5:
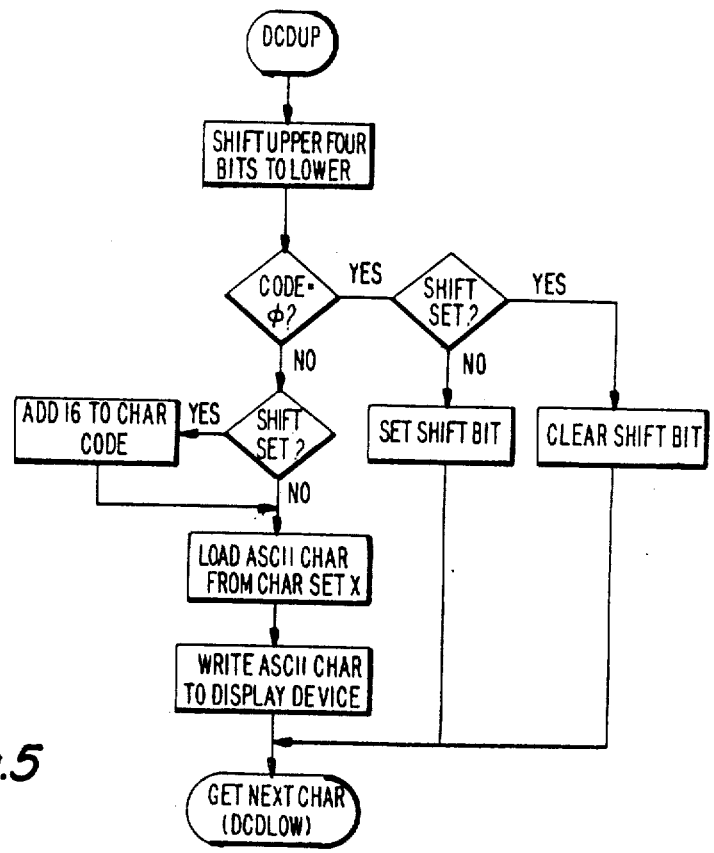
Figure 6:
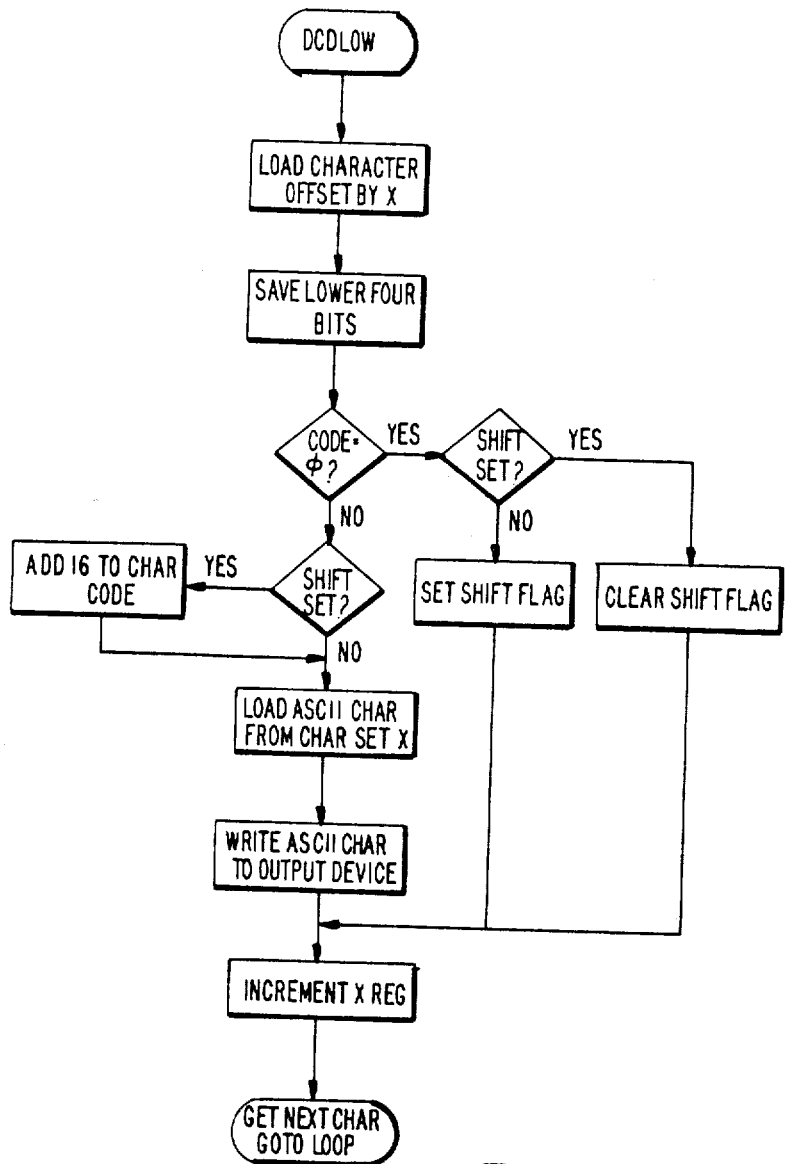

FIGS. 4, 5 and 6 are flow charts illustrating one way in which the compacted characters stored in ROM 42 may be decompacted by processor 40 of micro-computer 30. In FIG. 4 the first step comprises clearing (resetting the zero) a shift flag and a register (X). Clearing the shift flag is important because in the present invention the shift code signifies only that a change in character sets has occurred, it does not identify the set as in the Baudot code format. This provides a known starting point for decoding. Initially characters will be decoded as coming from set "A" of FIG. 2. Subsequent characters will be decoded in accordance with changes in the shift flag. The first test is for an EOT (end of transmission, 00000000 binary, 00 Hex, char=0 as shown). If the end of a character string (FIGS. 9-13) is found (code 00000000) then the message is complete and the program ends. If not, the upper (DCUP) 4-bit nibbles of the 8-bit character code are decoded to ASCII by the routine of FIG. 5 and then the lower 4-bit nibbles are decoded to ASCII by the routine of FIG. 6. This process repeats (loops) back to FIG. 4 until all characters of a message have been decoded to ASCII and the EOT code (00 Hex) has been detected. Specifically, as shown in FIG. 5, the first character of a message is represented by the first four bits of the 8-bit double code. These four bits are shifted into the lower four bits of the accumulator of processor 40 and represent the location of the ASCII code for that particular character. If the character is zero (hex), it is a shift character and the shift level bit (flag) is reversed. It is set to one is previously equal to zero or to zero if previously equal to one. This effectively toggles the shift bit. If the character is not zero, it represents a character code of set "A" and is used to load the ASCII code of the set "A" character (from FIG. 2) into the accumulator of processor 40. If the shift level is zero, the character of table "B" is loaded.

After the first four bits are decoded, the lower 4-bits of the code is reloaded in the accumulator as shown in FIG. 6. This represents the second character of the "double-code". This character is decoded in the same manner as in FIG. 5. This process repeats until all 4-bit "nibbles" of each 8-bit code word are examined and decoded using the table of FIG. 2 and outputted to character generator 36 for display on display 22.

Figure 7:
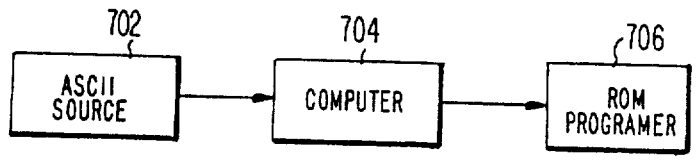
FIG. 7 is a block diagram of a system for compacting ASCII text in a ROM in accordance with the invention.
Figure 8:
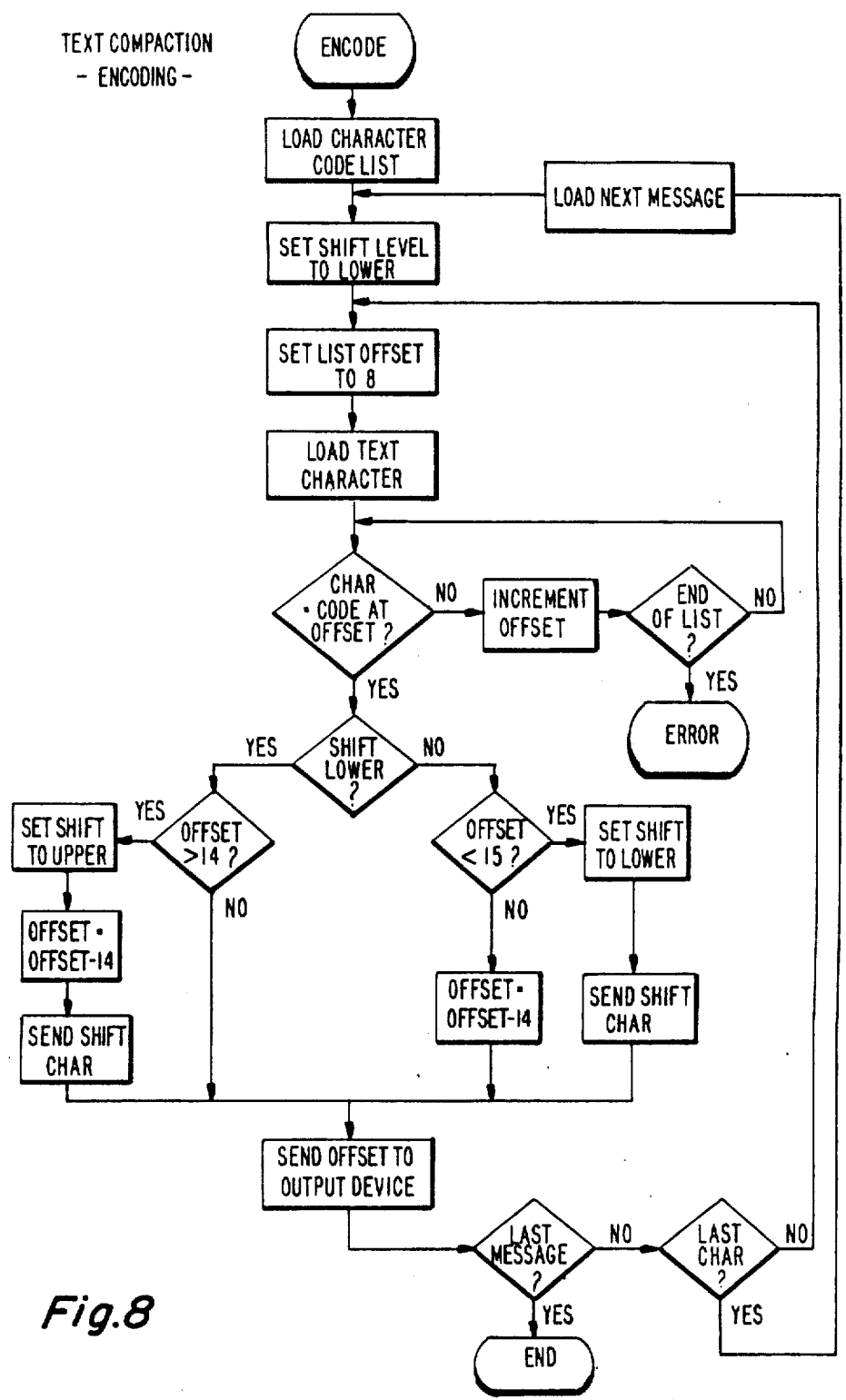
FIG. 8 is a flow chart illustrating operation of the system of FIG. 7.

FIG. 7 provides an example of apparatus suitable for encoding text characters as herein before described. The apparatus comprises a source 702 for providing ASCII characters to a computer 705 which is coupled to a ROM programming unit 706. In operation, ROM 42 is inserted in unit 706 and programmed by computer 704 as shown in the flow chart of FIG. 8. The flow chart includes branches 802 and 804 for determining if a character of a message is set "A" or set "B" of the tables of FIG. 2 and inserts the shift character 0000 in the character sequence when a change of character sets occurs. There are numerous alternatives to the particular routine shown. What is important, for purposes of the present invention, is that character be identified as belonging to one of two sets and that a unique shift character be inserted in the character sequence when a change of character sets occurs.

In the following claims the term "nibble" refers to an integer sub-multiple of a byte. As an example, all characters are stored as 4-bit codes. This corresponds to two "nibbles" of an 8-bit organized memory. It corresponds to 3 "nibbles" of a 12 bit organized memory. It corresponds to 4 "nibbles" of a 16-bit organized memory and so forth.

What is claimed is:

1. A method of compacting characters for storage, comprising:
   generating a sequence of four-bit characters in which some characters are of a first character set and other characters are taken from a second character set;
   inserting a given four-bit shift character not taken from either character set in said sequence of characters every time a character of either set is followed by a character of the other set; and
   storing said sequence of characters and said shift character in a memory means in which each memory address represents at least one pair of stored characters, each character of said at least one pair being selected from said first character set said second character set and said given shift character.

2. A method as recited in claim 1 wherein said memory means stores said characters in 8-bit bytes.

3. A method as recited in claim 1 wherein said characters exclude the letters J, Q, X and Z.

4. A method as recited in claim 1 wherein there are 15 characters in said first character set and 15 characters in said second character set.

5. Apparatus for decompacting four-bit characters stored in a memory in a format wherein each memory address location stores at least a pair of said four-bit characters, comprising:
   means for reading said memory and providing a sequence of said characters in which each individual character of said sequence is a selected one of of a first character set, a second character set and a unique shift indicating character that separates characters from different sets to indicate that a change of character set has occurred in said sequence;
   first and second code tables; and
   means for alternately selecting said first and second code tables in response to each occurrence of said shift indicating character in said sequence for decoding all characters of said first set in accordance with said first code table for decoding all characters of said second set in accordance with said second code table to provide a sequence of decoded output characters.

6. Apparatus as recited in claim 5 wherein said apparatus comprises a micro-computer having a read-only-memory organized as 8-bits per byte.

7. Apparatus as recited in claim 5 wherein said memory is organized in multiples of 4 bits.

8. Apparatus as recited in claim 5 wherein said memory is organized to provide 8-bits per byte of storage.

* * * * *